United States Patent [19]

DeReggi et al.

[11] 4,166,229

[45] Aug. 28, 1979

[54] PIEZOELECTRIC POLYMER MEMBRANE STRESS GAGE

[75] Inventors: Aime S. DeReggi, Boyds; Seymour Edelman, Silver Spring, both of Md.

[73] Assignee: The United States of America as represented by the Secretary of the Navy, Washington, D.C.

[21] Appl. No.: 880,406

[22] Filed: Feb. 23, 1978

[51] Int. Cl.² .......................................... H01L 41/10
[52] U.S. Cl. .................................... 310/337; 310/800; 340/10; 340/8 PC
[58] Field of Search .................. 310/800, 337; 340/10, 340/8 PC

[56] References Cited

U.S. PATENT DOCUMENTS

| | | | |
|---|---|---|---|
| 3,249,913 | 5/1966 | Smyth et al. | 340/10 |
| 3,353,150 | 11/1967 | Jacox | 340/10 |
| 3,375,489 | 3/1968 | Kompanek | 340/8 PC |
| 3,798,474 | 3/1974 | Cassand et al. | 310/800 X |
| 3,947,644 | 3/1976 | Uchikawa | 310/800 X |

FOREIGN PATENT DOCUMENTS 51-40791  4/1976  Japan ........................................ 310/800

*Primary Examiner*—Mark O. Budd
*Attorney, Agent, or Firm*—Richard S. Sciascia; Arthur A. McGill; Prithvi C. Lall

[57] ABSTRACT

Apparatus and method for detecting pressure variations because of acoustic waves by modulating a preset tensile stress in a stretched thin sheet of a piezoelectric polymer. The modulation is provided by the changing stress caused by an impinging acoustic signal or the like. The piezoelectric polymer sheet under a preset tension acts effectively as a membrane resulting in a high output combined with a high resonance frequency and a wide operating frequency range.

6 Claims, 2 Drawing Figures

PIEZOELECTRIC POLYMER MEMBRANE STRESS GAGE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to a piezoelectric polymer membrane stress gage and more particularly to an acoustic transducer which uses a piezoelectric polymer sheet under a preset tensile stress.

Conventional sound sensing devices include piezoelectric crystals which, when subjected to variations in pressure resulting from an acoustic pressure wave, generate electrical signals which can be processed using electronic devices. However, their use in thin line arrays impose many difficulties such as problems resulting from the use of electronic devices associated therewith. Furthermore, the piezoelectric crystals or ceramics are inflexible and heavy which render them unsuitable for thin line arrays. It is thus desired to have a piezoelectric polymer which maintains its flexible characteristics and/or is of low density and is neutrally buoyant for it to be suitable for towed thin line arrays. Efforts have been made in the past to use transducers including a high molecular weight polymer which is piezoelectric to sense pressure waves. However, these transducers are not free-flooding type and can not be used in a medium such as water. It is thus essential to have a free-flooding transducer which has the voltage signal generated in response to an acoustic pressure wave shielded from the water in which the transducer is being used. Additionally, it is desirable to have an acoustic transducer which is not affected by the mechanical shocks when put in a body of water.

SUMMARY OF THE INVENTION

The piezoelectric electro-acoustic transducer of the present invention is a free-flooding device for measuring changes in pressure due to acoustic wave traveling in a body of water. The transducer preferably includes four thin sheets of a high molecular weight polymer which shows piezoelectric characteristics. Each side of each of the four sheets has a conducting metal evaporated thereon. Two of the four sheets are placed together at the top of a cylinder or pad of a sponge-like compressible material and the remaining two sheets of the polymer are placed below the cylinder of the sponge-like material. The upper two sheets of the polymer and the lower two sheets of the polymer are cemented together so as to enclose the cylinder. A conducting lead wire is placed between the top two sheets and a similar conducting lead wire is placed between the bottom two sheets. The two lead wires are combined to form one terminal of the transducer. There are holes drilled into the polymer sheets for allowing water to pass therethrough to make the transducer free-flooding. The sheets of the polymer which get to be in contact with the water, when the transducer is placed in water, are electrically connected together to form a ground terminal which serves as the second terminal of the transducer. A polymer used in the transducer has acoustic properties similar to those of water to reduce the number of reflections of sound at the water-polymer interface when a high potential is applied between the two terminals of the transducer. When the transducer is placed in a body of water, the polymer sheets thereof, under the influence of an acoustic wave, contract and expand without tearing and generate signals which are proportional to the pressure variations due to the impinging acoustic wave.

An object of subject invention is to have a flexible piezoelectric electro-acoustic transducer.

Another object of subject invention is to have a piezoelectric electro-acoustic transducer which is of lightweight and is neutrally buoyant.

Still another object of subject invention is to have a flexible lightweight piezoelectric electro-acoustic transducer which is suitable for towed line arrays.

Still another object of subject invention is to have a piezoelectric electro-acoustic transducer which is of free-flooding type.

Still another object of subject invention is to have a flexible piezoelectric electro-acoustic transducer wherein the voltage signal generated in response to an impinging acoustic wave is shielded.

Another object of subject invention is to provide a flexible, lightweight transducer wherein the polymer sheets used therein contract and expand without tearing.

Still another object of subject invention is to have a flexible piezoelectric electro-acoustic transducer which uses a polymer having properties similar to those of water in order to reduce the acoustic reflections of the impinging acoustic waves.

Other objects, advantages and novel features of the invention will become apparent from the following detailed description of the invention when considered in conjunction with the accompanying drawings wherein:

DESCRIPTION OF THE PREFERRED EMBODIMENT

Figure 1:
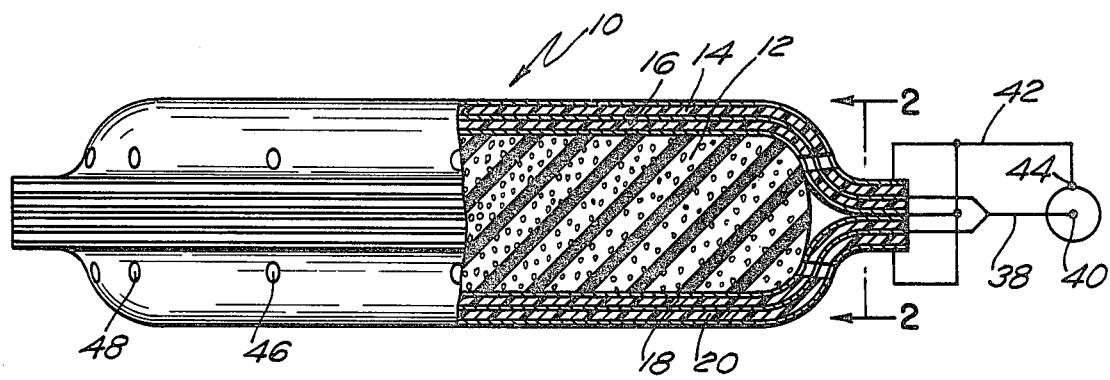
FIG. 1 is a schematic representation of a piezoelectric electro-acoustic transducer made according to the teachings of subject invention.
Figure 2:
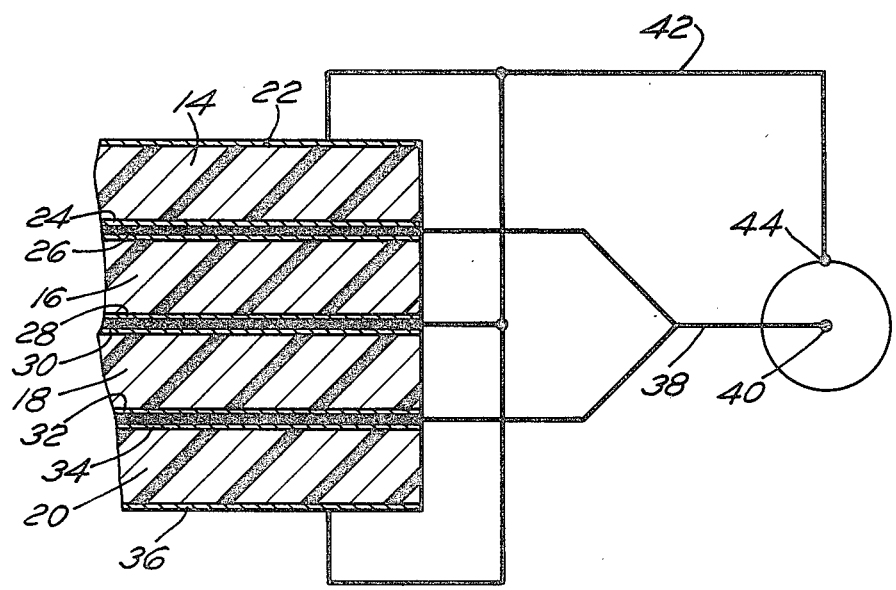
FIG. 2 is a cross-section of FIG. 1 taken along line 2—2 thereof.

Referring to the drawings wherein like reference characters designate like parts throughout the several views, and more particularly to FIG. 1 thereof, a schematic representation of transducer 10 built according to the teachings of subject invention is shown. Transducer 10 includes a pad 12 of a compressed flexible open-pore material in the form of a cylinder enclosed by sheets 14 and 16 of piezoelectric polymer at the top of the foam rubber pad 12 and two sheets 18 and 20 of the piezoelectric polymer at the bottom thereof. The cylindrical pad 12 has preferably low height as compared to the diameter thereof. The cylindrical pad 12 when covered by sheets 14, 16, 18 and 20 generally takes the form of a dome or the like. Any other configuration for 12 is also possible. Pad 12 keeps sheets 14, 16, 18 and 20 under tension and the sensitivity of the transducer depends upon maintaining this tension. Pad 12 is preferably made of an open-pore foam and is soaked in a detergent so that it is readily wetted without forming any bubbles. The piezoelectric polymer of which sheets 14, 16, 18 and 20 are made of is preferably polyvinylidene fluoride (PVF$_2$). However, any other suitable piezoelectric polymer can be substituted without deviating from the teachings of subject invention. Each of polymer sheets 14, 16, 18 and 20 is coated with an evaporated metallic film such as that of aluminum at the both sides thereof. As an example, polymer sheet 14 has a metallic layer 22 at the top and 24 at the bottom thereof, polymer sheet 16 has a metallic layer 26 evaporated at the top and metallic layer 28 evaporated at the bottom thereof. Likewise, polymer sheet 18 has an evaporated metallic film 30 at the top and 32 at the bottom thereof and polymer sheet 20 has metallic layer 34 evaporated at the top and metallic layer 36 evaporated at the bottom thereof. Metallic layers 24, 26, 32 and 34 are connected to a single lead 38 which is connected to terminal 40 whereas metallic layers 22, 28, 30 and 36 are connected to a single lead 42 which is in turn connected to terminal 44 which acts as a ground terminal for the transducer. Polymer sheets 14, 16, 18 and 20 are glued together along the circumference of the cylindrical rubber pad 12. A plurality of holes such as 46 and 48 in sheets 14, 16, 18 and 20 along the circumference of the pad 12 such as are provided to make the transducer a free-flooding unit so that the water pressure inside and outside the transducer is equalized and the sensitivity is independent of the depth and depends on maintaining some tension applied to the polymer sheets. It is to be noted that holes such as 46 and 48 are small and do not allow equalization of pressure inside the transducer due to the acoustic field. Furthermore, this configuration insulates the voltage signal generated by the transducer in response to the acoustic field from the seawater and provides complete shielding and grounding. Thus the voltage signal is shielded from the seawater and terminal 44 acts as a ground terminal for the device. It is to be noted further that the polymer of which the sheets enclosing the foam rubber pad are made of has a specific gravity which is so close to that of water that buoyancy can be adjusted easily by selection of the padding material. Furthermore, the piezoelectric polymer used is such that it has a large value of the piezoelectric modulus which makes the transducer built according to the teachings of subject invention a much better hydrophone than a ceramic hydrophone. Furthermore, the polymer used is such that it is not affected by seawater, soap, detergents, oils, gasoline, or the common organic solvents. It should be noted that the piezoelectric activity of the polymeric materials used for the sheets enclosing the rubber foam pad arises from their molecular structure. A polymer is a long chain of identical units called monomers. The monomers of $PVF_2$ contain hydrogen and fluorine atoms which produce a strong dipole moment. Ordinarily, the dipoles in such a material are randomly oriented. However, upon heating of the materials, the molecules are rendered mobile and applying a strong electric field tends to orient the dipoles normal to the plane of the sheet. Upon cooling of the sample, the dipoles are frozen in their new orientation. Consequently, with a significant number of dipoles aligned, any stimulus such as an acoustic pressure wave which changes the thickness of the sheets of the polyvinylidene material will cause charges to come out on the surface forming a signal appearing either as an electric current or voltage variation. The acoustic response of the transducer made as outlined above changes with the various materials used. Furthermore, the frequency range for a flat response of the transducer and the frequency where the peak response occurs can be controlled by proper choice of parameters of construction.

These parameters allow the piezoelectric activity of different polymers to be maximized. If the activity of a number of different polymers is sufficient for a given application, the polymer to be used can be chosen to have mechanical, electrical and chemical properties suited for a particular application. Furthermore, one should be able to build units or transducers with a preselected frequency range or with a peak response at a selected frequency. In an array, this would allow use of the transducers with overlapping peak response or with a series of peak responses at desired frequencies. This kind of control of the response of an array can be obtained by obtaining a good knowledge of properties of the materials used in the construction of the units. It should further be pointed out that in case of the transducers fabricated according to teachings of subject invention, no rigid frame is used and the transducers are free-flooding type which enables them to be independent of depths so far as their acoustic response is concerned.

Briefly stated, an acoustic transducer according to the teachings of subject invention includes an open-pore foam pad in the form of a cylinder enclosed in a pair of sheets at the top thereof and another pair of sheets of a piezoelectric polymer at the bottom thereof. All the layers of the four sheets of the two pairs used are coated with evaporated metallic film and the sheets are joined together along the circumference of the cylindrical pad. Two terminals are provided, one for the voltage signal generated in response to the impinging acoustic wave and the second terminal for shielding the voltage signal from seawater. The tension to the polymer sheets is maintained. The polymer sheets include a plurality of holes to make the transducer free-flooding. The parameters of the transducers are adjusted to change its frequency response according to the application for which it is designated.

Obviously, many modifications and variations of the present invention may become apparent in the light of the above teachings. As an example, a piezoelectric polymer other than polyvinylidene fluoride ($PVF_2$) can be used without deviating from the teachings of subject invention. Furthermore, the design of the structure of the transducer can also be adjusted to make it respond more effectively at one range of frequency as compared to the rest of the frequency spectrum. Furthermore, flexible open-pore foam pad can take configurations other than a cylinder without deviating from the teachings of subject invention. The transducer can be used either as a hydrophone or as an acoustic source. It is therefore understood that within the scope of the appended claims the invention may be practiced otherwise than specifically described.

We claim:

1. A stress gage for detecting acoustic pressure waves in a body of water, comprising:
   a compressible generally cylindrical pad having a bottom and a top;
   a first pair of flexible sheets of a piezoelectric polymer being stretched over the top of said pad under a tensile stress, each sheet of said first pair of flexible sheets having an evaporated metallic film deposited on each face thereof;
   a second pair of flexible sheets of the piezoelectric polymer stretched over the bottom of said pad under the tensile stress, each flexible sheet of said second pair having an evaporated metallic film deposited on each face thereof;

means for joining said first pair of flexible sheets and said second pair of flexible sheets along the circumference of said compressible pad;

a plurality of openings in said first pair and said second pair of flexible sheets along the circumference of said compressible pad; and means for extracting electrical signals from said first pair and said second pair of flexible sheets when said stress gage is subjected to acoustic pressure waves.

2. The stress gage of claim 1 wherein said means for extracting electrical signals from said first pair and said second pair of flexible sheets includes a first lead connecting the evaporated metallic films not exposed to water forming a first terminal and a second lead connecting the evaporated metallic films exposed to water forming a second terminal.

3. The stress gage of claim 1 wherein said piezoelectric polymer is poly-vinylidene fluoride.

4. The stress gage of claim 1 wherein said compressible pad is made of flexible open-pore foam.

5. The stress gage of claim 4 wherein said compressible pad has the diameter larger than the height thereof.

6. The stress gage of claim 3 wherein said gage is neutrally buoyant.

* * * * *